United States Patent [19]

Laakso et al.

[11] Patent Number: 4,650,545

[45] Date of Patent: Mar. 17, 1987

[54] POLYIMIDE EMBEDDED CONDUCTOR PROCESS

[75] Inventors: Carl W. Laakso, Portland; John J. Reagan; Robert L. Beckman, both of Beaverton, all of Oreg.

[73] Assignee: Tektronix, Inc., Beaverton, Oreg.

[21] Appl. No.: 703,066

[22] Filed: Feb. 19, 1985

[51] Int. Cl.[4] .......................... C23F 1/00; C23F 1/02; B44C 1/22; B29C 37/00

[52] U.S. Cl. .................... 156/655; 156/233; 156/652; 156/656; 156/668; 156/902; 29/846

[58] Field of Search ........................ 156/233, 629–634, 156/652, 655, 656, 659.1, 666, 668, 901, 902; 29/846, 848, 856, 867, 874, 883; 174/68.5; 427/96

[56] References Cited

U.S. PATENT DOCUMENTS

| | | | |
|---|---|---|---|
| 3,039,177 | 6/1962 | Burdett | 29/848 |
| 3,350,250 | 10/1967 | Sanz et al. | 156/233 X |
| 3,711,625 | 1/1973 | Dupuis | 156/261 X |
| 4,125,441 | 11/1978 | Dugan | 156/650 X |
| 4,141,782 | 2/1979 | Dugan et al. | 156/643 |
| 4,231,154 | 11/1980 | Gazdik et al. | 29/847 X |
| 4,306,925 | 12/1981 | Lebow et al. | 156/154 X |
| 4,396,457 | 8/1983 | Bakermans | 156/902 X |
| 4,517,051 | 5/1985 | Gazdik et al. | 156/668 X |

*Primary Examiner*—William A. Powell
*Attorney, Agent, or Firm*—Francis I. Gray

[57] ABSTRACT

A polyimide embedded conductor process assures adherence of a metal conductor to a polyimide layer and allows closer spacing between conductors. The conductor is laid on a sacrificial substrate, and then the polyimide layer is laid over the conductor and substrate. The substrate is etched away to expose the conductor, and the polyimide layer may be etched away from the conductor to form attachment tabs.

3 Claims, 6 Drawing Figures

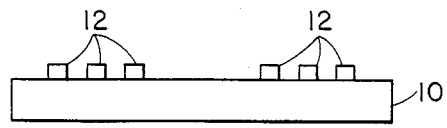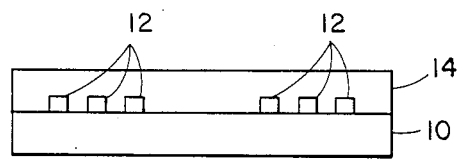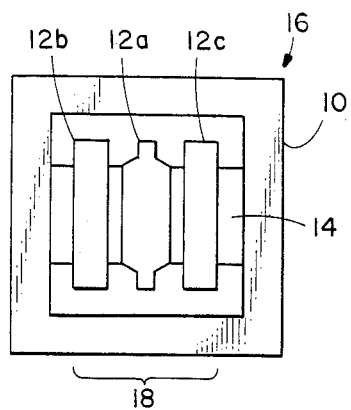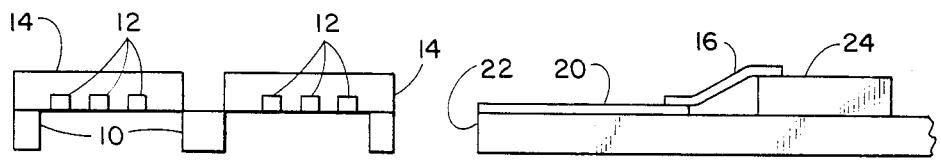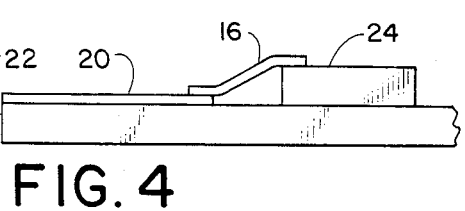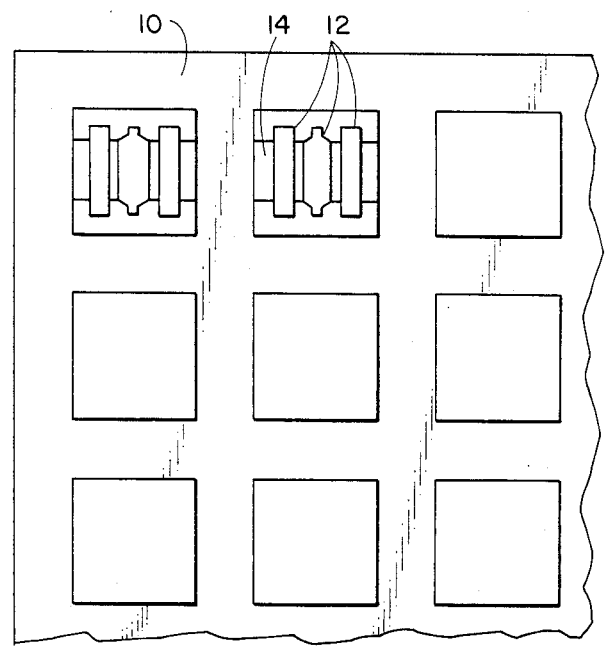

POLYIMIDE EMBEDDED CONDUCTOR PROCESS

BACKGROUND OF THE INVENTION

1. Field of the Invention

The present invention relates to flexible circuit processes, and more particularly to a polyimide embedded conductor process.

2. Description of the Prior Art

Polyimide is a standard material used for flexible circuitry. However, the conductors made of electrically conductive metals such as gold do not readily adhere to the surface of the polyimide. Additionally for micro-circuitry it is sometimes desirable to have adjacent conductors as close together as possible. The dielectric constant of air where the conductors are deposited on the surface of the polyimide does not allow close spacing of the conductors. Therefore, it is desired to formulate a process whereby the metal conductors adhere to the polyimide, and whereby the dielectric constant between conductors may be altered to allow closer spacing between conductors.

SUMMARY OF THE INVENTION

Accordingly, the present invention provides a polyimide embedded conductor process which assures adherence of a metal conductor to a polyimide layer and which allows close spacing between conductors. A plurality of metal conductors are laid on a sacrificial substrate in a desired pattern. A polyimide layer is laid down over the substrate and conductors. Excess polyimide is etched away using a photolithographic process, and the substrate is etched away to expose the conductors.

Objects, advantages and novel features of the present invention will be apparent from the following detailed description when read in conjunction with the appended claims and attached drawing.

BRIEF DESCRIPTION OF THE DRAWINGS

FIGS. 1a, 1b and 1c illustrate the steps in a polyimide embedded conductor process according to the present invention for a particular application.

FIG. 2 is a bottom plan view of a transmission line interconnector fabricated according to the process of the present invention.

FIG. 3 is a bottom plan view of a mass produced group of transmission line interconnectors of FIG. 2.

FIG. 4 is a side plan view showing the transmission line interconnector of FIG. 2 connecting a substrate to a hybrid circuit.

DESCRIPTION OF THE PREFERRED EMBODIMENT

Referring now to FIGS. 1a, 1b and 1c a sacrificial substrate 10 is selected. Upon the sacrificial substrate 10 is laid a plurality of conductors 12 in a desired configuration. Then a polyimide layer 14 is laid over the conductors 12 and substrate 10, with the polyimide material filling the spaces between the conductors if so desired. The polyimide layer 14 may be etched away in a desired configuration, using standard photolithographic techniques, to form attachment tabs or the like. The substrate 10 is etched away in a desired pattern, or completely, exposing the conductors 12 embedded in the polyimide layer 14.

In FIG. 2 an interconnect circuit 16 is shown produced by the process described above. The substrate 10 may be of a metallic material, such as a 70/30 copper/nickel alloy, which could be used as part of the circuit, and is typically three mils thick. The conductors 10 may be of an electrically conductive material, such as gold, copper, silver, aluminum or the like, and are either deposited or, in the case of a metallic substrate 10, electroplated onto the substrate with a thickness typically of eight microns. For the particular interconnect circuit 16 shown the conductors 12 form a segment of a transmission line 18 having a central conductor 12a with ground planes 12b and 12c, respectively, on either side. The polyimide layer 14 is laid over the conductors 12 with a thickness of approximately 1.5 mils. The substrate 10 is then etched away to form a frame in this instance. Finally the polyimide layer 14 is etched away to leave the ends of the conductors 12 bare for attachment to other circuits. These interconnect circuits 16 can be replicated many times in a sheet form as shown in FIG. 3.

Alternatively, the conductor pattern may first be etched into the sacrificial substrate 10 before the conductors 12 are laid on the substrate. In this instance after the polyimide layer 14 has been laid and the substrate 10 etched away, a portion of the conductors 12 will be exposed above the surface of the polyimide layer.

Referring now to FIG. 4 an interconnect circuit 16 fabricated according to the present invention is shown interconnecting a transmission line 20 on a substrate 22 to a hybrid IC circuit 24. The exposed ends, or attachment tabs, of the conductors 12 are attached respectively to the transmission line 20 and pads on the hybrid IC circuit 24 by conventional techniques. The polyimide between the conductors 12 allows the closer spacing of the conductors, and the embedment of the conductors allows the conductors to adhere to the polyimide.

Thus, the present invention provides a polyimide embedded conductor process where an electric circuit is built up in reverse order on a sacrificial substrate which is subsequently etched away.

What is claimed is:

1. A polyimide embedded conductor process comprising the steps of:
   depositing a single layer conductor directly on a sacrificial substrate in a particular configuration;
   laying on a polyimide layer over said conductor and said sacrificial substrate; and
   etching away said sacrificial substrate to expose said conductor;
   whereby said conductor is securely attached to said polyimide layer.

2. A process as recited in claim 1 further comprising the step of selectively etching away said polyimide to expose portions of said conductor to form attachment tabs.

3. A process as recited in claim 1 further comprising the step of etching said particular configuration into said sacrificial substrate prior to said depositing step.

* * * * *